United States Patent [19]

Germer

[11] Patent Number: 4,628,526

[45] Date of Patent: Dec. 9, 1986

[54] METHOD AND SYSTEM FOR MATCHING THE SOUND OUTPUT OF A LOUDSPEAKER TO THE AMBIENT NOISE LEVEL

[75] Inventor: Horst Germer, Schortens, Fed. Rep. of Germany

[73] Assignee: Blaupunkt-Werke GmbH, Hildesheim, Fed. Rep. of Germany

[21] Appl. No.: 649,824

[22] Filed: Sep. 12, 1984

[30] Foreign Application Priority Data

Sep. 22, 1983 [DE] Fed. Rep. of Germany ....... 3334262
Jul. 14, 1984 [DE] Fed. Rep. of Germany ....... 3426068

[51] Int. Cl.$^4$ ............................................. H04R 27/00
[52] U.S. Cl. ....................................... 381/57; 381/94; 381/108
[58] Field of Search ....................... 381/56, 57, 86, 92, 381/94, 96, 108

[56] References Cited

U.S. PATENT DOCUMENTS

| | | | |
|---|---|---|---|
| 3,497,622 | 2/1970 | Markin | 381/57 |
| 3,814,856 | 6/1974 | Dugan | 381/57 |
| 4,061,874 | 12/1977 | Fricke | 381/57 |
| 4,380,824 | 4/1983 | Inoue | 381/86 |
| 4,417,098 | 11/1983 | Chaplin | 381/94 |
| 4,476,571 | 10/1984 | Tokumo | 381/57 |
| 4,506,381 | 3/1985 | Ono | 381/108 |
| 4,553,257 | 11/1985 | Mori | 381/57 |

FOREIGN PATENT DOCUMENTS

| | | | |
|---|---|---|---|
| 2413829 | 9/1975 | Fed. Rep. of Germany | 381/57 |
| 3133107 | 10/1983 | Fed. Rep. of Germany | 381/94 |

OTHER PUBLICATIONS

"Störgeräuschabhängige automatische Lautstärkesteuerung", Aug. 1980, Seite 539, Radio Fernsehan Elektronic, Band 29, Nr. 8, Berlin.

J. Graeme, "Feedback Lowers AGC Distortion", Jan. 1981, p. 202, Electrical Design News, Boston, Mass.

A. Hafner, "Geräuschabhängige elektronische Lautstärkeeinstellung EL 100", 1971, Seiten 186–189, Technische Mitteilungen Aeg-Telefunken.

Primary Examiner—Gene Z. Rubinson
Assistant Examiner—L. C. Schroeder
Attorney, Agent, or Firm—Frishauf, Holtz, Goodman & Woodward

[57] ABSTRACT

A microphone picks up a signal in response to both the acoustic output of the speaker and the ambient noise at the loudspeaker location, for example, in an automobile. The microphone output signal and the signal which is to be provided to the loudspeaker with variable amplification are each subjected to envelope detection. The two envelope curve signals are compared to produce a signal representative of their similarity, the similarity being high when ambient noise is low or absent. The similarity signal is then processed with reference to a reference voltage which varies with the setting of the manual volume control of the amplifier interposed ahead of the loudspeaker. That amplifier has an automatic volume control input to which a control signal generated in response to the envelope similarity signal is applied to raise the amplification and the loudspeaker output level when ambient noise, detected by the similarity of the envelope signals, is present or increases. The system and method have the advantage that special calibration of the system in place of use, for proper balancing of the microphone output against the useful signal is made unnecessary. The envelope signal comparison is simply performed by comparing the respective signs of the slopes of the respective envelope curves to supply a first output value when the signs are identical and a second output value when they are opposite. The output values are weighted by a factor dependent upon signal dynamics (derived from average value and dynamic range) to reduce the larger output value and at the same time increase the smaller one by a dynamic factor. The succession of weighted output values thus produced is integrated to produce the similarity signal.

20 Claims, 8 Drawing Figures

METHOD AND SYSTEM FOR MATCHING THE SOUND OUTPUT OF A LOUDSPEAKER TO THE AMBIENT NOISE LEVEL

This invention concerns the automatic matching of the output level of a loudspeaker to the noise level in its neighborhood and is particularly applicable for control of the output loudness of a radio broadcast receiver in a motor vehicle.

In such methods and systems, the sound output is so adjusted with reference to the noise level in the neighborhood of a loudspeaker, that the reproduction level of the loudspeaker signal, which may be referred as the useful signal level, is always a few decibels (dB) greater than the ambient noise level. In that manner, the useful signal radiated from the loudspeaker is perceived by the listeners as having always the same loudness, independently of the intensity of the ambient noise at the particular time.

In a known method of this kind there is used as the level-setting magnitude the noise components due to ambient noise which are contained in a microphone output signal. For this purpose a compensating voltage is produced which is equal to the useful signal components contained in the microphone output signal, derived from the loudspeaker signal, and this compensating voltage is subtracted from the microphone output voltage. With correct magnitudes of the compensating voltage, the ambient noise components appear as the difference voltage which can then be provided as the amplification setting magnitude to a controlled amplifier for the useful signal.

In a circuit for carrying out the method just described, the loudspeaker input voltage or useful voltage, is supplied to a voltage amplifier of which the amplification factor is of a critical magnitude, because the magnitude of the useful components is dependent on various factors, as for example the counteractive circuit relation of microphone and loudspeaker, on the characteristics of the room, compartment or other location in which the loudspeaker is located, and on whether more than one loudspeaker is used to radiate the useful signal and the spatial disposition of the speakers when two or more of them are used. An adjustment device is provided to set the amplification factor, by which the voltage amplification can be varied according to the placement of the microphone at the loudspeaker location until an adjustment is found at which the influence of the loudspeaker signal on the automatic level setting is no longer appreciable.

Such adjustment or calibration of the circuit at its place of use in every case is expensive and troublesome and requires trained personnel specialized for this operation, so that the installation cannot be satisfactorily performed, for example in the case of automobile radios equipped with such circuits, in the automobile dealers' workshops. Furthermore, for optimal operation of the circuit, the adjustment must be fitted or matched to conditions of the equipment's use that are inherently changeable, for example they must be suited to the passenger compartment of a vehicle. In a fully occupied vehicle passenger compartment, as distinguished from an empty car interior, a change in the adjustment of the circuit may be necessary in order for the circuit to work optimally.

SUMMARY OF THE INVENTION

It is an object of the invention to provide a method and system for automatic loudspeaker volume control that is independent of influences of the characteristic of the loudspeaker location and thus makes it unnecessary to provide adjustment of the circuit to characteristics or data of the room or passenger compartment in which the loudspeaker is located and can also operate satisfactorily even in case of a change of the characteristics of the enclosed space, in which the loudspeaker is located.

Briefly, the envelope curves of the useful signal and of the microphone output signal are continuously checked or compared for similarity and a similarity signal is produced proportional to the degree of similarity of these envelope curves, after which the setting magnitude for the amplification of the useful signal is derived from the similarity signal.

In the method and system of the invention, the electrical ambient noise components contained in the microphone signal are also a measure for the setting magnitude of the controlled amplifier, because the envelope curves of the microphone output signal and of the useful signal at the loudspeaker input become more similar to each other the smaller the ambient noise component contained in the acoustic signal may be. By the derivation of the setting magnitude for the controlled amplifier out of the similarity signal of the envelope curves, in accordance with the invention, the influence of the spatial configuration of the loudspeaker location, as for example the shape and occupancy of the passenger compartment of a vehicle, the loudspeaker to microphone spacing, the kind of loudspeaker, the balance and volume control setting, the related coupling factors between loudspeaker and microphone on the one hand and ambient noise and microphone on the other, are all eliminated. Propagation time delays of the composite acoustic signal made up of the loudspeaker output signal and ambient noise are practically negligible compared to the useful signal, so that no delay device is necessary for the earlier-occurring signal. Propagation time differences, when two or more loudspeakers are used, likewise have practically no effect.

Furthermore, the similarity comparison of the envelope curves provides the possibility of constituting the method and system of the invention in digital form with the use of a computer, which has the features, on the one hand, of a fully adequate low frequency for the sampling of the envelope curves and, on the other hand, short integration times for the formation of the setting magnitudes, because of the already great similarity of the envelope curves compared to the similarity of the respective signals themselves from which the envelope curves are derived.

It is particularly advantageous, for derivation of the setting magnitude from the similarity signal, to compare the latter with a reference value dependent upon a preselected loudness or volume level, and to generate the amplification setting magnitude out of the difference between the similarity signal and the reference value, preferably by integration of the difference values. By that preferred method, an integrating type of control is obtained which brings the difference signal to zero.

A further advantageous embodiment is provided when, for derivation of the amplification setting magnitude from the similarity signal, at least a part of the range of variation of the similarity signal is subdivided into steps corresponding to a series of thresholds and, as the similarity signal passes through these thesholds, a previously selected output level is raised or reduced by one step according to the direction in which the particular threshold is passed, especially when each step of the range has an upper and a lower switching threshold and the amplification setting magnitude is raised when the similarity signal goes down through the lower switching threshold and is reduced when the similarity signal oversteps the upper threshold. These provisions make possible an especially sensitive matching of the amplifier control behavior to the subjective loudness impression on the human ear, especially when the method is carried out digitally. The range of control is limited above and below, so that overcontrol and undercontrol is safely avoided in extreme situations.

Another advantageous version of the method and system is provided when, for purposes of cross-checking similarity, the signs of the respective slopes of the envelope curves are continuously determined and compared with each other. When the signs are the same, a predetermined first value is then provided as an output and when they are different, a predetermined second value different from the first is provided as an output. The similarity signal is then constituted as the average of the output values and preferably the first predetermined output value is greater than the second predetermined output value. The similarity cross-check and the obtaining of the simiarlity signal is quite simply obtained by these measures. The greater the ambient noise components in the acoustic signal, the more frequently slopes having different signs appear in the envelope curves and the smaller the similarity signal becomes.

An advantageous further development of the embodiment just mentioned is provided when the average value and dynamic range of each of the envelope curves is determined and a dynamic factor is obtained therefrom, by which the predetermined first and second output values are weighted. By this provision, even acoustic noise signals without any dynamic of their own are drawn into the recognition of ambient noise and adjustment of the amplification of the loudspeaker output volume level.

Another advantageous embodiment of the invention is provided when the dynamic factor is derived as the difference between the average of the envelope signal derived from the microphone output and the ratio of the dynamic ranges of the respective envelope signals multiplied by the average of the envelope of the useful signal, especially when the weighting is carried out so that the larger predetermined output value is reduced by the dynamic factor and the smaller predetermined output value is increased by the dynamic factor. In this manner, the conditions are optimized in matching the system to the noise level without inherent dynamics in such a way that satisfactory results are obtained for the listener.

Another advantageous embodiment of the invention is provided when an upper and a lower threshold are fixed for the similarity signal and the amplification setting magnitude is changed only when the similarity signal lies outside of the range between these thresholds. By such provisions, the loudspeaker volume level matching is not changed by transient dynamics of the useful and ambient noise signals and automatic volume adjustment takes place only when the value of the similarity signal is found outside of a tolerance range which extends on both sides of some desired or reference value. This reference value is preferably selected as a desired loudspeaker output level.

It is also advantageous to detect pauses in the useful signal and to suppress comparison of the envelope curves, for similarity during the signal pauses. In this way undesired increase of the volume after the end of pauses in the useful signal are prevented, which might result from the fact that the similarity signal in signal, pauses in which there is appreciable ambient noise, becomes very small and thereby results in a large amplification setting magnitude.

It is useful to constitute the system of the invention with a controlled amplifier in circuit ahead of the loudspeaker having a manual volume control, a microphone for picking up composite acoustic signals made up of the loudspeaker output and ambient noise, a control circuit for generating an amplification magnitude proportional to ambient noise for the controlled amplifier. In accordance with the invention the control circuit contains two envelope curve detectors of which one has its input connected to the input of the controlled amplifier and the other has its input connected to the microphone output, a comparison circuit being connected with the outputs of the envelope curve detectors for generating a similarity signal representative of the similarity of the aforesaid envelope curve, a setting magnitude generator being connected to the output of the comparison circuit and having an output connected to the control input of the controlled amplifier. In particular, it is advantageous for the setting magnitude generator to include a subtraction circuit and an integrator operating on the output of the subtraction circuit, one input of the subtraction circuit being supplied with the similarity signal and the other input there of being connected to a reference value signal preferably dependent upon the setting of the manual volume control. Further useful features of the system apparatus are given in the detailed description that follows further below.

BRIEF DESCRIPTION OF THE DRAWINGS

The invention is further described by way of illustrative examples with reference to the annexed drawings, in which.

DESCRIPTION OF THE ILLUSTRATED EMBODIMENTS

Figure 3:
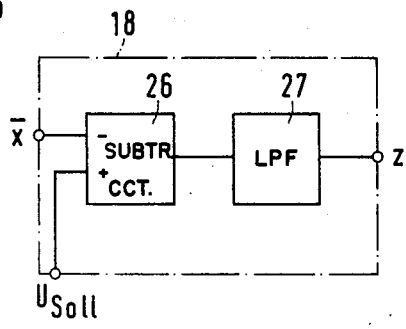
FIG. 3 is a block circuit diagram of an amplification magnitude setting signal generator for the system of FIG. 1.

In the method and system for matching the volume level of a loudspeaker 10 of an automobile radio to the ambient noise level at the loudspeaker location, i.e., in the passenger compartment of the automobile, shown in FIG. 1, a microphone 11 is used that simultaneously picks up the acoustic loudspeaker output signal radiated from the loudspeaker, hereinafter also referred to as the useful signal, and the ambient noise in the automobile passenger compartment. A speaker volume setting magnitude z for supply to a controlled amplifier 12 normally contained in an automobile radio, is generated from the electrical output signal of the microphone 11, and the useful signal $U_{Nutz}$ is accordingly amplified to a degree depending upon the ambient noise level for supply to the loudspeaker. The envelope curves of the electrical signal $U_{Nutz}$ and of the electrical output signal of the microphone are continuously crosschecked for similarity and a similarity signal $\bar{x}$ is generated which is proportional to the degree of similarity of the envelope curve. The more similar the two envelope curves are, the greater the similarity signal is. The envelope curves, accordingly, are all the more similar to each other, the lower the ambient noise level is. In accordance with a first method and system illustrated in FIG. 3, the similarity signal $\bar{x}$ is compared with a predetermined reference value $U_{Soll}$ which is preferably determined in a manner dependent upon the previously selected speaker volume level. The volume level, in turn, is set by the operator or user of the system to a desired value by means of a manual volume control 13 which serves as a reference value source 28 for the automatic volume level control.

The difference between similarity signal and reference value is integrated in order to form the setting magnitude signal z supplied to the control input 14 of the controlled amplifier 12. The speaker output volume level previously set manually is then modified by this setting magnitude z.

Figure 4:
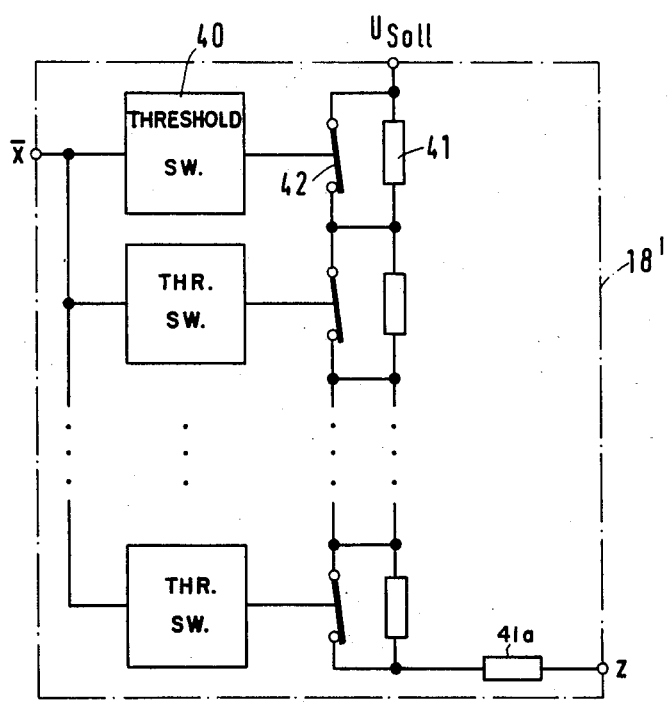
FIG. 4 is a block circuit diagram of a second embodiment of an amplification setting signal generator for use in the system of FIG. 1.

According to a second method and system illustrated in FIG. 4, the range of variation of the similarity signal $\bar{x}$ is subdivided by threshold stages into steps and as the similarity signal $\bar{x}$ runs through these threshold-defined steps, the volume level at the time is raised or lowered by one step according to the direction in which the similarity signal $\bar{x}$ is changing. The initial value of the volume level is given by the reference voltage $U_{Soll}$. An upper and a lower switching threshold can be provided for each step, in which case control is performed by increasing the amplification setting magnitude z each time the signal $\bar{x}$ goes below the lower threshold and reducing z each time the signal $\bar{x}$ goes above the upper threshold. The reference voltage $U_{Soll}$ is, in turn, set by the reference value 28 constituted as a part of the volume control 13.

The method of operation above described can be carried out either digitally, which may be done with use of a microprocessor, or else in analog fashion. In the embodiments illustrated in the drawings, the performance of the method in a circuit of the analog type has been illustrated. It is well known in the art how to constitute corresponding digital circuits, so that further illustration of corresponding systems operating digitally does not need to be illustrated. In the illustrated circuit, and likewise in a digital version of these circuits, the electrical signal referred to as the useful signal $U_{nutz}$ which is applied to the signal input of the controlled amplifier 12, is also supplied to an envelope curve detector 15 and the microphone output electric signal is supplied to a second envelope curve detector 16. The detectors 15 and 16 are part of a control system 36 for the amplifier 12 which also includes a comparator circuit 17 and an amplification setting magnitude generator 18 or 18', as well as a reference value unit 28 forming part of the volume control 13 of the amplifier 12. The outputs of the envelope detectors 15 and 16 are supplied to the inputs of the comparator 17 and the output of the latter, as well as that of the reference voltage source 28, are supplied to the generator 18 or 18' which generates a signal z that is furnished to the control terminal 14 of the amplifier 12. The output signal of the comparator 17 is a result of comparison or cross-checking of the outputs of the detectors 15 and 16 simultaneously present at the terminals a and b, and constitutes the similarity signal $\bar{x}$.

Figure 2:
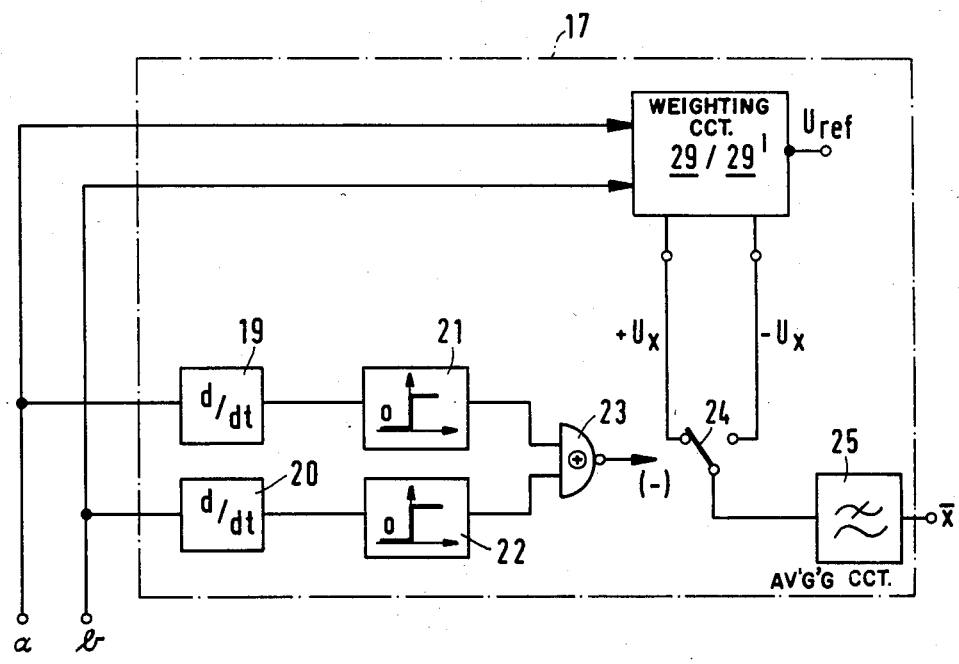
FIG. 2 is a block circuit diagram of a comparison circuit for producing a similarity signal in the system of FIG. 1.

One embodiment of the comparison circuit 17 is illustrated in circuit block form in FIG. 2. There the outputs of the envelope curve detectors 15 and 16 respectively present at the inputs a and b of the comparison circuit 17 are respectively connected to differentiators 19 and 20, the outputs of which are in turn respectively connected to null voltage comparators 21 and 22. The outputs of the null voltage comparators 21 and 22 are respectively connected to the inputs of a coincidence detector 23, in this case an equivalence gate, and the output of the latter is utilized to operate a change-over switch 24. According to the output of the coincidence detector 23, the switch 24 applies a positive or a negative voltage $U_x$ to an averaging circuit constituted as a low-pass filter 25, so that an upper or a lower output voltage value will be made available at the output (transfer contact) of the change-over switch 24.

The differentiators 19 and 20 respond to changes in the envelope curve signals. If the change, which is to say the slope, of the envelope curve is positive, a logic "1" signal is provided at the output of the corresponding null voltage comparator 21 or 22, whereas if the slope is negative, a logic "0" signal is provided there. When the signs of the slopes of the respective envelope curves are identical, a logic "1" signal appears at the output of the coincidence circuit 23 and the switch 24 takes the position illustrated in FIG. 2. In the other case, which is to say when the slopes are of different signs, a logic "0" signal appears at the output of the coincidence circuit 23 and the switch 24 connects the low-pass filter 25 with the voltage value $-U_x$. At the output of the low-pass filter 25 the time-averaged value of the applied voltage quantities $+U_x$ and $-U_x$ is made available and serves as the similarity signal $\bar{x}$. This similarity signal approximates the value $+U_x$ when the envelope curves are identical and goes towards zero when the envelope curves are extremely unlike each other. In the case of the corresponding digital circuit, the envelope curve signals appearing at the inputs a and b of the comparison circuit would be sampled at a sampling frequency and the individual sample values would be compared digitally with each other.

The comparison could be made of contemporaneous samples directly, or contemporaneous differences between successive samples of the respective envelope curves could be compared.

Figure 1:
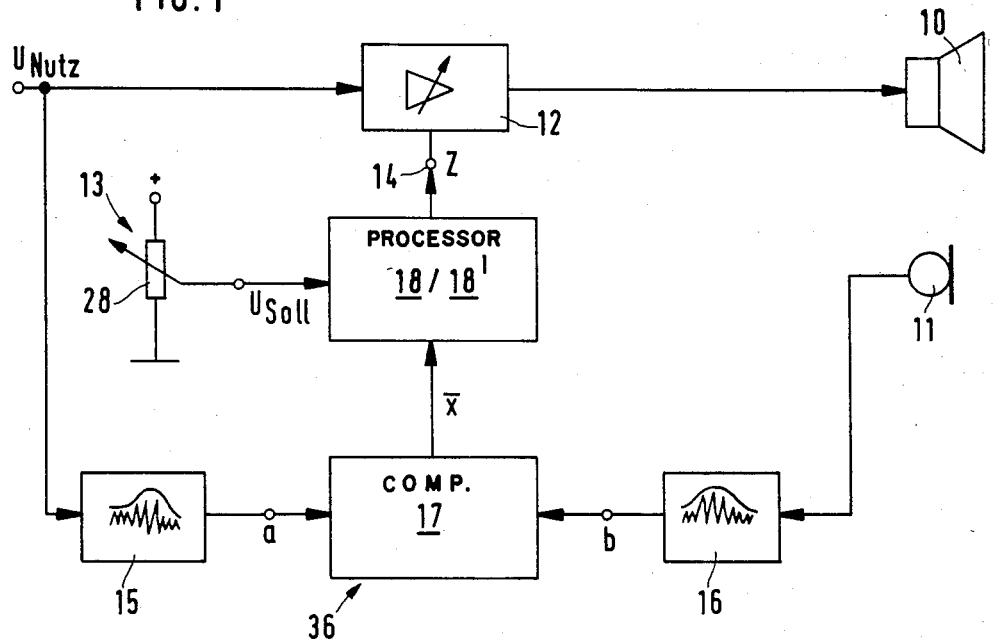
FIG. 1 is a block circuit diagram of a system for automatically fitting the output level of a loudspeaker to ambient noise conditions in the passenger compartment of the vehicle in which the loudspeaker is located.

The similarity signal $\bar{x}$ is supplied to the amplitude setting magnitude generator designated 18/18' in FIG. 1. This designation indicates that either the generator 18 of FIG. 3 or the generator 18' of FIG. 4 may be used. The output of the generator 18 or 18' is in each case an amplification setting magnitude z generated in response to the similarity signal $\bar{x}$ and taking into account the reference voltage provided by a portion of the volume control 13 constituted as reference voltage source 28, to which the generator 18 or 18' is also connected. In the embodiment shown in FIG. 3, the setting magnitude generator 18 includes a subtraction circuit 26 followed by an integrator 27. The similarity signal $\bar{x}$ is applied to one input of the subtraction circuit 26 and the predetermined setting voltage $U_{Soll}$ is supplied to the other input of the setting magnitude generator 18. The difference voltage at the output of the subtraction circuit 26 is integrated in the integrator 27 and directly supplied to the control input 14 of the controlled amplifier 12 as the setting magnitude z. The signal generators 18 and 18' may be called processors, because they process the signal $\bar{x}$ to produce the processed signal z.

In the embodiment shown in FIG. 4, the setting magnitude generator 18' for the controlled amplifier 12 of FIG. 1 has a multiplicity of threshold switches 40 and an equal number of damping elements 41 each shunted by a switch 42. These damping elements 41, which may be simply resistors, are all connected in series in the embodiment chosen for illustration. The series circuit of the several damping elements 41, including in this case an additional series resistor 41a without a shunt switch, is connected between the output of the reference voltage source 28 and the signal output of the setting magnitude generator 18' where the setting magnitude signal z is made available. Each damping element 41 can be shunted down out of the series circuit by a short-circuiting switch 42 operated by a corresponding threshold switch 40, the symbolic showing in FIG. 4, with a switch operated by a threshold circuit 40, corresponding to the usual connections well known in the art for providing the same electrical result in response to operation, for example, of a Schmitt trigger circuit.

Each threshold switch 40 has built-in hysteresis, as is common in Schmitt trigger circuits for example, so that it has an upper switching threshold and a lower switching threshold, and it is connected in circuit in such a way that when the signal $\bar{x}$ rises through the upper switching threshold, the short-circuit across the corresponding damping element 41 is opened (switch 42), so that the damping element 41 becomes an effective series element in the above-mentioned series connection, with the result that the setting magnitude z is reduced by one step. When the signal $\bar{x}$ diminishes and falls past the lower switching threshold of one of the threshold switches 40, the corresponding switch 42 is closed, bridging the corresponding damping element 41, effectively removing it from the series circuit, so that the setting magnitude z is raised by one step. The switching thresholds of the threshold switches 40, are established so as to define a series of steps, the relative magnitudes of which are such as to provide a control characteristic for the amplifier 12 that optimally fits the loudness sensitivity of the human ear.

If the similarity signal $\bar{x}$ takes on its highest value $U_x$ (which means that the microphone output signal and the useful signal are identical and, therefore, no ambient noise is present) all of the switches 42 are open. The setting magnitude z supplied to the controlled amplifier 12 is at its minimum value and accordingly depend entirely on the setting of the volume control 13. As soon as ambient noise appears, the envelope curve signals are less similar and the value of the similarity signal $\bar{x}$ declines. As soon as it drops below the lower switching threshold of the threshold switch 40 corresponding to the highest step of the similarity signal range, the corresponding switch 42 is closed and the setting magnitude z is raised by one step. When the similarity signal drops down below the lower switching threshold of the threshold switch 40 corresponding to the next highest step of the similarity signal range, the latter responds, the setting magnitude signal z is raised by additional amount, which may be the same or different according to the characteristic chosen to fit the sensitivity of the human ear, and so on. When the envelope signals are extremely dissimilar, the similarity signal $\bar{x}$ has a value of about zero and all the switches 42 are closed. The setting magnitude z supplied to the controlled amplifier 12 is then at its maximum value.

The above-described control mechanism utilizes the dynamics of the signals. Since in practice, however, noise signals are found without appreciable dynamics and still produce disturbance, the output values $+U_x$ and $-U_x$ made available at the output of the changeover switch 24 are weighted, as will now be described, in order to deal with such noise signals. For this purpose, the average value and the dynamic range is determined for both of the envelope curve signals respectively derived from the useful signal and from a microphone output signal and presented to the comparison circuit 17 at the respective inputs a and b. A dynamic or weighting factor is obtained from these average values and dynamic ranges which serves to weight these output values.

According to a first method, the dynamic factor is calculated as the quotient of the envelope curve ratios of the envelope curve signals. By envelope curve ratios is meant here the quotient of the average value to the dynamic range of an envelope curve signal.

According to a second method, which provides substantially better results, the dynamic factor is constituted as the difference between the average of the envelope curve signal derived from the microphone output signal and the product obtained by multiplying the average value of the useful signal envelope signal by the ratio of the dynamic ranges of the respective envelope signals derived from the microphone output signal and from the useful signal. The weighting is produced in such a way that the greater output value is reduced by the dynamic factor and the smaller output value is increased by the dynamic factor.

Figure 5:
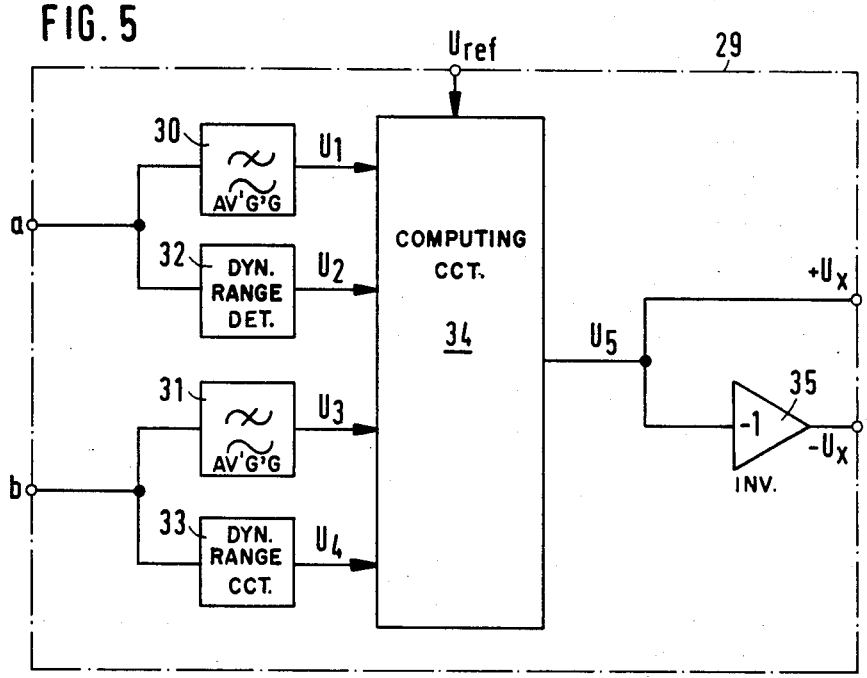
FIG. 5 is a block circuit diagram of a first embodiment of weighting circuit for use in the system of FIG. 1.
Figure 6:
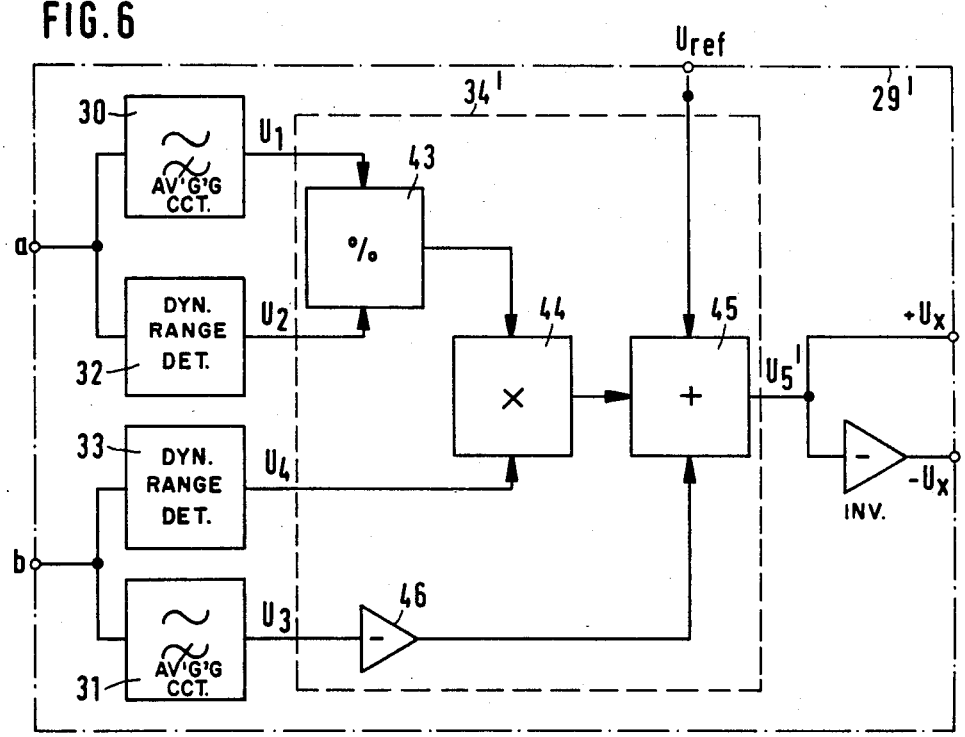
FIG. 6 is a block circuit diagram of a second embodiment of weighting circuit for use in the system of FIG. 1.

For weighting of the output values $+U_x$ and $-U_x$, the comparison unit 17 has a weighting circuit 29 or a weighting circuit 29', the former being shown in FIG. 5 and the latter in FIG. 6. In each case (29 or 29'), the inputs a and b of the comparison unit 17 respectively connected to the outputs of the envelope curve detectors 15 and 16 are connected to averaging circuits constituted in the illustrated case as the low-pass filters 30 and 31 respectively, and also to the respective dynamic detectors 32 and 33. The dynamic detectors 32 and 33 are converters for converting the peak value of the envelope signals into a d.c. voltage. Such a converter can consist of two peak detectors and a subtraction circuit, with one peak detector detecting the upper or positive peaks of the envelope curve signal and the other the lower or negative peaks.

The respective inputs of the two low-pass filters 30 and 31 and the two dynamic detectors 32 and 33 are supplied to a computing circuit 34 in the case of FIG. 5 or 34' in the case of FIG. 6. The output of the computing circuit 34 is the voltage $U_5$ and the output of the computing unit 34' is the voltage $U_{5'}$. The voltage $U_5$ or the voltage $U_{5'}$ is directly used as the weighted voltage value $+U_x$ for supply to one input of the change-over switch 24 and its negative is provided through an inverter 35 in the case of FIG. 5 and 35' in the case of FIG. 6 to provide the weighted voltage value $-U_x$ for the other input of the change-over switch 24.

The computing circuit 34 of FIG. 5 produces the d.c. voltage $U_5$ out of its input voltages $U_1$, $U_2$, $U_3$ and $U_4$ from the circuits 30, 31, 32 and 33 and a reference d.c. voltage $U_{ref}$ according to the formula $$U_5 = \frac{U_1 \cdot U_4}{U_2 \cdot U_3} U_{ref}.$$

The dynamic factor a given by $$a = \frac{U_1 \cdot U_4}{U_2 \cdot U_3}$$

has the value 1 when there is no ambient noise and is otherwise always smaller than 1. By means of the weighting circuit 29, the result is obtained that the greater voltage value $+U_x$ is reduced by a certain amount determined by the dynamic factor a while the smaller voltage value $-U_x$ is increased by the same amount when the envelope curve ratio $U_3/U_4$ corresponding to the microphone output signal is greater than the envelope curve ratio $U_1/U_2$ of the useful signal. As already mentioned, by envelope curve ratio is meant the ratio of the average value $U_1$ or $U_3$ to the peak-to-peak value $U_2$ or $U_4$ of the corresponding envelope curve signal.

The computing circuit 34' in the weighting system 29' of FIG. 6 produces the voltage $U'_5$ out of the input voltages $U_1$ to $U_4$ and the reference d.c. voltage $U_{ref}$ (which corresponds to the maximum value of the microphone signal) according to the formula $$U'_5 = U_{ref} - \left[ U_3 - U_1 \cdot \frac{U_4}{U_2} \right].$$

For this purpose, the computing circuit 34' includes a divider 43, a multiplier 44, and an adding circuit 45 which are connected to each other and with the outputs of the low-pass filters 30 and 31 and of the dynamic detectors 32 and 33 in the manner shown in FIG. 6. An inverter 46 is interposed between the input of the adding circuit 45 and the output of the low-pass filter 31. The voltage $U'_5$ is then utilized directly and in inverted form respectively as the weighted voltage values $+U_x$ and $-U_x$ which are supplied to the change-over switch 24.

The dynamic factor b which in this case is given by the formula $$b = U_3 - U_1 \frac{U_4}{U_2}$$

is always zero when no ambient noise is present and with increasing ambient noise it goes towards the value $U_{ref}$. Since the weighting in the illustrated embodiment always operates so that the unweighted greater voltage value is reduced by the dynamic factor b and the smaller unweighted voltage value is increased by the dynamic factor b, it follows that the similarity signal $\bar{x}$ is given by the formula $$\bar{x} = (2W - 1) \cdot (U_{ref} - b).$$

where W is the probability for identical signs of the slopes of the respective envelope curve signals (W = 1 for identical signals and W = 0.5 for uncorrelated envelope curve signals). If therefore either the ambient noise is very high (b→$U_{ref}$) or if no similarity of the envelope curve signal is present (W = 0.5), the result is the smallest possible similarity signal $\bar{x} = 0$ which produces a maximum amplitude setting magnitude z. Conversely, when there is no ambient noise (b→0) and maximum envelope curve congruence (W = 1), the maximum similarity signal $\bar{x} = U_{ref}$ is obtained, which produces a minimum amplitude setting magnitude z.

Figure 7:
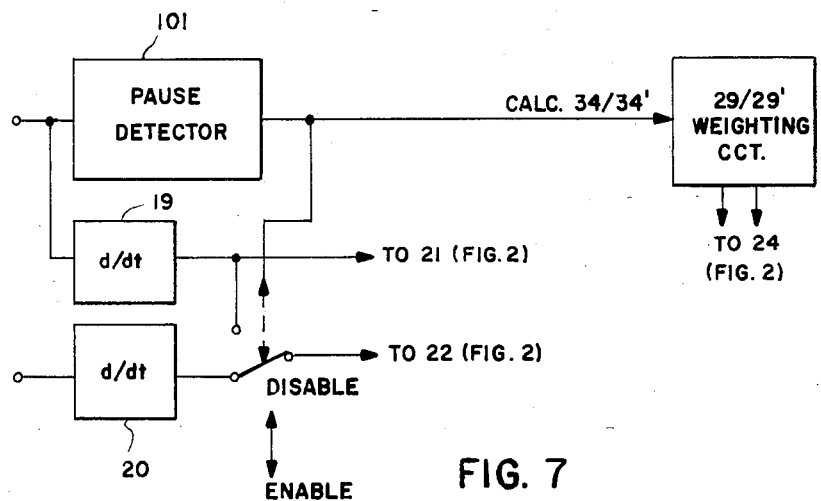
FIG. 7 is a block diagram of a circuit for suppressing the provision of a similarity signal during pauses of the useful signal.

The comparison of the envelope curves of the electrical useful signal $U_{Nutz}$ and of the electrical signal of the microphone output to provide a similarity signal is carried out only outside of signal pauses of the useful signal. This can be done either with software controlling the computing unit 34 or the computing unit 34' or by hardware. FIG. 7 is a block diagram for the hardware case. The signal pauses of the useful signal are detected in the pause detector 101 connected to the input of the loudspeaker 10, which provides an output which disables the comparator 17. The disabling is preferably done by setting the input or the output of the low-pass filter 25 to a suitable predetermined fixed value and may be accompanied by setting the input b to zero as a suitable initial value for the end of the pause.

The suppression of the comparison operation during pauses of the useful signal prevents the similarity signal from becoming very small in signal pauses when there is no ambient noise and thereby building up a large amplification setting value.

Figure 8:
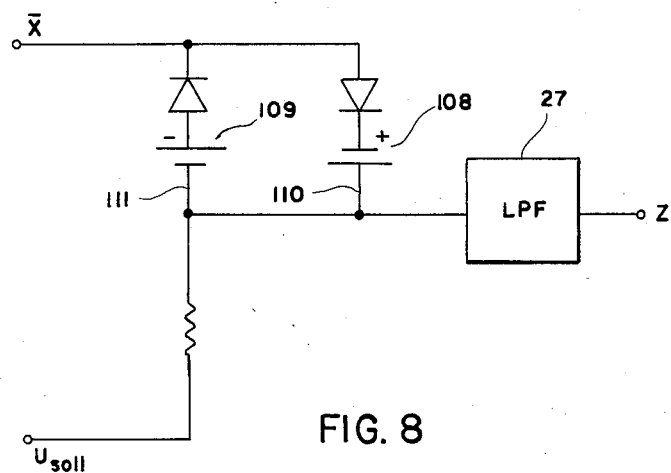
FIG. 8 is a diagram of a circuit for permitting a change of the amplification setting magnitude z only when the value of the similarity signal $\bar{x}$ lies outside of a predetermined tolerance window.

It is further advantageous to suppress influence of transient dynamics of the useful and ambient noise signals from producing a loudness adjustment by permitting a change of the amplification setting magnitude z only when the value of the similarity signal $\bar{x}$ lies outside of a predetermined tolerance window. In the case of the setting magnitude generator 18 according to FIG. 3, this tolerance window is placed so as to bracket the reference value $U_{Soll}$. This scheme is illustrated in FIG. 8 where the generator 18'' for the signal z is supplied not only with $U_{Soll}$, but with voltages somewhat higher and somewhat lower than $U_{Soll}$ supplied by bias batteries 108 and 109. Clamp circuits 110 and 111 are provided feeding into the low-pass filter 27 in such a way that the output z is equal to $U_{Soll}$ so long as $\bar{x}$ is not outside of the tolerance range established by the bias batteries, but in other cases rises above or falls below $U_{Soll}$.

The invention is not limited to the illustrated embodiment or to circuits using analog components. Equivalent digital circuits will be evident to persons skilled in the art on the basis of the present disclosure. In particular, it is useful in the digital case for the voltage values $+U_x$ and $-U_x$ to be respectively a predetermined magnitude and zero respectively, and their average calculated in arithmetic logic unit (ALU) forms the similarity signal $\bar{x}$. The processing of the useful signal and the microphone output signal is essentially the same in the digital case and the manner of operation of the digital apparatus corresponds to the above description of the illustrated embodiments, taking account of the well-known particular requirements for implementation in digital technology.

An EXCLUSIVE-OR gate, together with the transfer switch 24, can be used to provide a coincidence circuit instead of the coincidence circuit 23 which was illustrated in the form of an equality gate. For a given position of the change-over switch 24, the connection of the outputs of the EXCLUSIVE-OR gate are the reverse of those illustrated for the coincidence element 23.

Although the invention has been described with reference to particular illustrative examples, it will be understood that variations and modifications are possible within the inventive concept.

I claim:

1. Method of automatically adjusting the acoustic output volume of a loudspeaker to accord with changes in ambient noise level at the loudspeaker location, said loudspeaker having a controllable amplifier equipped with a manual volume control interposed between it and the output of a source of useful signals to be acoustically radiated and equipped with an amplification control terminal, comprising steps of:
   producing a composite signal at the output of a microphone exposed to both the acoustic output of said loudspeaker and ambient noise;
   producing a first envelope signal by envelope-detecting said useful signal provided at said output of said useful signal source;
   producing a second envelope signal by envelope-detecting said composite signal;
   continually comparing said first and second envelope signals with each other with respect to at least one parameter thereof and thereby generating a signal representative of the degree of similarity of said envelope signals to each other;
   providing a reference signal value corresponding to the setting of said manual volume control;
   producing a difference signal by comparing said similarity signal with said reference signal value, and
   intergrating said difference signal and applying the integrated difference signal to said control terminal of said amplifier.

2. Method of automatically adjusting the acoustic output volume of a loudspeaker to accord with changes in ambient noise level at the loudspeaker location, said loudspeaker having a controllable amplifier interposed between it and the output of a source of useful signals to be acoustically radiated and equipped with an amplification control terminal comprising the steps of:
   producing a composite signal at the output of a microphone exposed to both the acoustic output of said loudspeaker and ambient noise;
   producing a first envelope signal by envelope-detecting said useful signal provided at said output of said useful signal source;
   producing a second envelope signal by envelope-detecting said composite signal;
   continually comparing said first and second envelope signals with each other with respect to at least one parameter thereof and thereby generating a signal representative of the degree of similarity of said envelope signals to each other
   subdividing at least part of the range of said similarity representative signal into steps defined by the thresholds of a plurality of threshold switches;
   raising or lowering, according to the direction of change of said similarity representative signal the value of an output signal by one discrete increment whenever said similarity rep resentative system passes through the threshold of one of said threshold switches, and
   applying said output signal to said control terminal of said amplifier.

3. Method according to claim 2, in which said amplification control signal is increased when the value of said similiarity representative signal declines past the threshold of one of said threshold switches and said amplification control signal is reduced when the value of said similarity representative signal increases past the threshold of one of said threshold switches.

4. Method according to claim 1, in which the step of comparing said first and second envelope signals is performed by detecting the respective signs of the slopes of said respective envelope signals and producing a predetermined first output value when said slope signs contemporaneously detected are the same and producing a predetermined second output signal value when said slope signs of said envelope signals are different, and in which method said similarity representative signal is constituted as the average of a succession of said output values.

5. Method according to claim 4, in which the additional steps are performed of obtaining the average value and the dynamic range of said first and of said second envelope signals, obtaining a dynamic factor from said average values and dynamic ranges, and then weighting said first and second output values with said dynamic factor.

6. Method according to claim 5, in which said dynamic factor is obtained by calculating the quotient of the envelope signal ratios of said first and second envelope signals, said envelope signal ratios being first obtained by obtaining the respective quotients of average value to dynamic range of said envelope signals.

7. Method according to claim 6, in which said first output value is greater than said second output value, and in which the step of weighting said output values of said dynamic factor is performed by reducing said first output value by a certain amount and increasing said second output value by the same amount in response to said dynamic factor whenever said envelope signal ratio of said second envelope signal is greater than the envelope signal ratio of said first envelope signal.

8. Method according to claim 5, in which the step of obtaining a dynamic factor is performed by determining the difference between the average of said second envelope signal and the product obtained by multiplying the average of said first envelope signal by the ratio of the respective dynamic ranges of said first and second envelope signals.

9. Method according to claim 8, in which said first output value is greater than said second output value and in which the step of weighting said output values is performed by reducing said first output value by said dynamic factor and increasing said second output value by said dynamic factor.

10. Method according to claim 1, in which the step of applying said difference signal to said amplifier control terminal is performed in such a manner that the voltage at said control terminal remains unchanged at a reference value while said difference signal changes within a predetermined tolerance range and is caused to change to a value other than said reference value when said difference signal lies outside said tolerance range.

11. Method according to claim 1, in which the additional steps are performed of detecting the occurrence of pauses in the useful signals provided by said output of said source of said useful signals, and suppressing any effective comparison of said first and second envelope signals with each other during said pauses, as detected by the pause-detecting step.

12. Method according to claim 2, in which the step of applying said output signal to said control terminal of said amplifier is performed in such a manner that the voltage at said control terminal remains unchanged at a reference value while said output signal changes within a predetermined tolerance range and is caused to change to a value other than said reference value when said output signal lies outside of said tolerance range.

13. Method according to claim 2, in which the additional steps are performed of detecting the occurrence of pauses in the useful signals provided by said output of said source of said useful signals, and suppressing any effective comparison of said first and second envelope signals with each other during said pauses, as detected by the pause-detecting step.

14. Apparatus for automatically adjusting the acoustic output volume of a loudspeaker, to accord with changes in ambient noise level at the loudspeaker, including an amplifier controllable with respect to the degree of amplification provided thereby, having a control input for electrical variation and setting of the degree of amplification as well as a manual volume control for setting the degree of amplification effective in the absence of ambient noise, said amplifier having its output connected to said loudspeaker and its input connected to a source of electrical audio signals destined for conversion into acoustic output, and a microphone for picking up the combined effect of the loudspeaker acoustic output and of the ambient noise and producing a composite electrical signal for derivation of an amplification setting magnitude signal therefrom for said amplifier control input and comprising, in accordance with the invention, first signal envelope detecting means connected to said audio signal source for detecting the envelope curve of said audio signals and thereby producing first envelope signals;

second signal envelope detecting means connected to said microphone for detecting the envelope curve of said composite signals and thereby producing second envelope signals;

comparison means connected to said first and second signal envelope detecting means for producing a signal representative of the similarity of the envelope curves respectively embodies in said first and second envelope signals;

a reference voltage source controllable in common with said manual volume control for producing a signal processing reference voltage, and signal processing means (18) connected to said comparison means and to said reference voltage source and to said amplifier control input for deriving an amplifier control signal from said envelope curve similarity representing signal, said signal processing means including a subtraction circuit (26) having a first input connected to the output of said comparison means for receiving said envelope curve similarity representing signal and a second input (26) connected to said reference voltage source.

15. Apparatus for automatically adjusting the acoustic output volume of a loudspeaker, to accord with changes in ambient noise level at the loudspeaker, including an amplifier controllable with respect to the degree of amplification provided thereby, having a control input for electrical variation and setting of the degree of amplification as well as a manual volume control for setting the degree of amplication effective in the absence of ambient noise, said amplifier having its output connected to said loudspeaker and its input connected to a source of electrical audio signals destined for conversion into acoustic output, and a microphone for picking up the combined effect of the loudspeaker acoustic output and of the ambient noise and producing a composite electrical signal for derivation of an amplification setting magnitude signal therefrom for said amplifier control input and comprising, in accordance with the invention, first signal envelope detecting means connected to said audio signal source for detecting the envelope curve of said audio signals and thereby producing first envelope signals;

second signal envelope detecting means connected to said microphone for detecting the envelope curve of said composite signals and thereby producing second envelope signals;

comparison means connected to said first and second signal envelope detecting means for producing a signal representative of the similarity of the envelope curves respectively embodies in said first and second envelope signals;

a reference voltage source controllable in common with said manual volume control for producing a signal processing reference voltage, and signal processing means (18') connected to said comparison means to said reference voltage source and to said amplifier control input for deriving an amplifier control signal from said envelope curve similarity representing signal, said signal processing means (18') comprising a multiplicity of threshold switches (40) and an equal number of damping elements (41) switchable in and out of circuit by the respective threshold switches, said damping elements being interposed in circuit between said voltage source (28) and said amplifier control input (14), the respective inputs of said threshold switches all being connected to the output of said comparison means for response to said envelope curve similarity representing signal.

16. Apparatus according to claim 15, in which said threshold switches are constituted so as to have switching hysteresis whereby an upper switching threshold is provided for up-switching and a lower switching threshold is provided for down-switching, and in which said damping elements (41) are so connected to said threshold switches that a damping element is switched out of circuit by down-switching and is switched into circuit by up-switching by the corresponding threshold switch.

17. Apparatus according to claim 14, in which said comparison means comprises first envelope slope detecting means (19) connected to the output of said first signal envelope detecting means, second envelope detecting means (20) connected to the output of said second envelope detecting means, first slope sign detecting means connected to the output of said first envelope slope detecting means, second slope sign detecting means (22) connected to the output of said second envelope slope detecting means and coincidence detecting means (23) having input respectively connected to the output of said first and second slope sign detecting means for indicating when the same slope sign indications respectively at said first and second slope sign detecting means are coincident, and averaging means (21) for producing a moving average signal in response to signals originating in the output of said coincidence means (23, 24).

18. Apparatus according to claim 17, in which dynamic signal weighting means (29, 29') are incorporated in said coincidence detecting means for modifying the output thereof by a dynamic factor, said dynamic signal weighting means incorporating first signal averaging means connected to the output of said first signal envelope detecting means for producing first averaged envelope signals ($U_1$) second envelope signal averaging means (31) connected to the output of said second signal envelope detecting means for producing second averaged envelope signals ($U_3$), first dynamic range detecting means (33) connected to the output of said first signal envelope detecting means for producing first envelope dynamic range signals ($U_2$), second dynamic range detecting means connected to the output of said second signal envelope detecting means for producing second envelope dynamic range signals ($U_4$), a second reference voltage source, calculating means having inputs respectively connected to said second reference voltage source, said first and second envelope signal averaging means and said first and second dynamic range detecting means for producing a dynamic factor signal ($U_5$) and signal inverting means (35, 35') for inverting said dynamic factor signal so that dynamic factor signal ($+U_x$) and its negative ($-U_x$) may be presented selectively as said envelope curve similarity representing signal to said signal processing means according to whether said coincidence detecting means detects identity or diversity of the slope signs respectively detected by said first and second slope sign detecting means (21, 22).

19. Apparatus according to claim 18, in which said calculating means is constituted so as to calculate said dynamic factor signal as the product obtained by multiplying the voltage of said second reference voltage source by the product obtained by multiplying the quotient of the outputs of said first envelope signal averaging means and said first dynamic range detecting means ($U_1/U_2$) by the quotient of the output of said second dynamic detecting means and said second envelope signal averaging means ($U_4/U_3$).

20. Apparatus according to claim 18, in which said calculating means (34') is constituted so as to produce said dynamic factor signal ($U'_5$) as the product of the output of said first envelope signal averaging means ($U_1$) and the algebraic sum of the quotient of said second and first dynamic range detecting means ($U_4/U_2$) less the output of said second envelope averaging means ($U_3$) plus the output of said second reference voltage source ($U_{ref}$).

* * * * *